United States Patent [19]

Botti

[11] Patent Number: 4,922,207
[45] Date of Patent: May 1, 1990

[54] SO-CALLED BRIDGE AUDIO AMPLIFIER

[76] Inventor: Edoardo Botti, Strada Milanese - 27036 Mortara, Pavia, Italy

[21] Appl. No.: 180,386

[22] Filed: Apr. 12, 1988

[30] Foreign Application Priority Data

Apr. 30, 1987 [IT] Italy ................................ 20337 A/87

[51] Int. Cl.[5] .............................................. H03F 3/68
[52] U.S. Cl. .................................. 330/84; 330/124 R; 330/146
[58] Field of Search ...................... 330/84, 124 R, 146, 330/295, 307; 381/120, 121

[56] References Cited

U.S. PATENT DOCUMENTS

| 4,494,077 | 1/1985 | Fukaya et al. | 330/295 |
| 4,539,529 | 9/1985 | Lenz | 330/84 X |
| 4,758,796 | 7/1988 | Verhoeven et al. | 330/84 |

OTHER PUBLICATIONS

Geiger, "50-W-Brückenschaltung Mit NF-IS", *Funkseham*, vol. 49, No. 14, Jul. 1, 1977, pp. 639-642.
Henke, "Stereo-Nachbrenner Für Das Autoradio", *Funkscham*, vol. 5, No. 19, Sep. 8, 1978, pp. 945-946.

Primary Examiner—James B. Mullins
Attorney, Agent, or Firm—Rosen, Dainow & Jacobs

[57] ABSTRACT

A so-called bridge audio amplifier, particularly for stereophonic car radio sets, comprises a first power amplifier in a non-inverting configuration which is connected to a second amplifier in an inverting configuration. This audio amplifier further comprises a first resistor pair forming a bridge circuit with the resistors of the first power amplifier, as well as a second resistor pair interconnected between a positive supply pole and ground and with the first and second amplifiers having their respective non-inverting inputs connected across the second resistor pair via respective input resistors. The audio amplifier of this invention requires but a very small number of input pins and may be used as a stereophonic amplifier.

17 Claims, 4 Drawing Sheets

SO-CALLED BRIDGE AUDIO AMPLIFIER

DESCRIPTION

This invention relates to a so-called bridge audio amplifier particularly for stereophonic car radio sets, of a type which comprises a power amplifier in a non-inverting configuration, with a feedback resistor connected between the output and the inverting input and a resistor connected between said input and ground, which is connected to a second amplifier in an inverting or non-inverting configuration.

BACKGROUND OF THE INVENTION

As is known, audio amplifiers of the type referred to above output respective push-pull signals on the output pair having the same amplitude and being adapted to supply a load with a maximum voltage which is twice as high as the power supply voltage.

Such amplifiers currently find their most extensive application to high output power car radio sets.

Low output power car radio sets still make wide use of conventional so-called single-ended stereophonic amplifiers the maximum output dynamic range whereof is the same as the power supply voltage. However, car radio set manufacturers have a need for high power audio amplifiers of the so-called bridge type, for operation as stereophonic amplifiers as well.

The current state of the art provides several solutions to the problem of forming a bridge-type amplifier from a pair of operational amplifiers.

A first solution consists of associating an amplifier, having a single input and a pair of outputs in push-pull relationship, with a pair of power amplifiers having their non-inverting inputs respectively connected to either output. The outputs of such amplifier pair are connected to the load.

However, this prior solution has the drawback that it involves circuit complexity and that the resulting amplifier cannot be used as a stereophonic amplifier.

A second solution consists of associating an inverting amplifier with a non-inverting one, with shared inputs and each output connected to a load comprising a stereophonic loudspeaker. This solution requires, however, a large number of external connecting components, in particular capacitors, and either has a low input impedance, or if the input impedance is high, is affected by high noise in the bridge configuration.

A third known solution comprises two signal amplifiers having high impedance differential inputs connected to the outputs of respective power amplifiers. By connecting the in-phase inputs of the signal amplifiers together and associating the outputs of the power amplifiers with a respective load, the stereophonic configuration is obtained for the whole amplifier.

However, this solution also has a highly complex circuitry and, in addition, requires a large number of pins on the so-called carrier package for the integrated circuit forming the amplifier, as well as a correspondingly high number of external connection capacitors.

Modern car radio sets are highly compact in size and usually comprise four amplification channels for driving four loudspeakers independently, and accordingly, a large number of pins on the respective packages for the various amplifiers are inconvenient to install in car radio set cases for which packages of limited width are to be preferred.

A fourth solution consists of arranging an operational amplifier to drive the output of a second amplifier in an inverting configuration and having unity gain. However, this solution also requires a large number of pins and of external connection capacitors.

SUMMARY OF THE INVENTION

The technical problem that underlies this invention is to provide a so-called bridge audio amplifier, particularly for stereophonic car radio sets, which requires a small number of external connection components and can be implemented as an integrated circuit with a small number of pins, to facilitate its installation within car radio sets and, therefore, obviate the cited drawbacks which affect the prior art.

This problem is solved by an audio amplifier of the kind specified above being characterized in that it comprises a first pair of resistors forming a bridge circuit with said resistors of said first amplifier, and a second pair of resistors connected together between a positive power supply pole and ground, said first and second amplifiers having the respective non-inverting inputs connected between said second resistor pair through respective input resistors.

BRIEF DESCRIPTION OF THE DRAWINGS

The features and advantages of the audio amplifier according to the invention will become apparent from the following detailed description of several exemplary embodiments thereof, to be taken by way of illustration and not of limitation, in conjunction with the accompanying drawings.

In the drawings.

DESCRIPTION OF THE PREFERRED EMBODIMENTS

Figure 2:
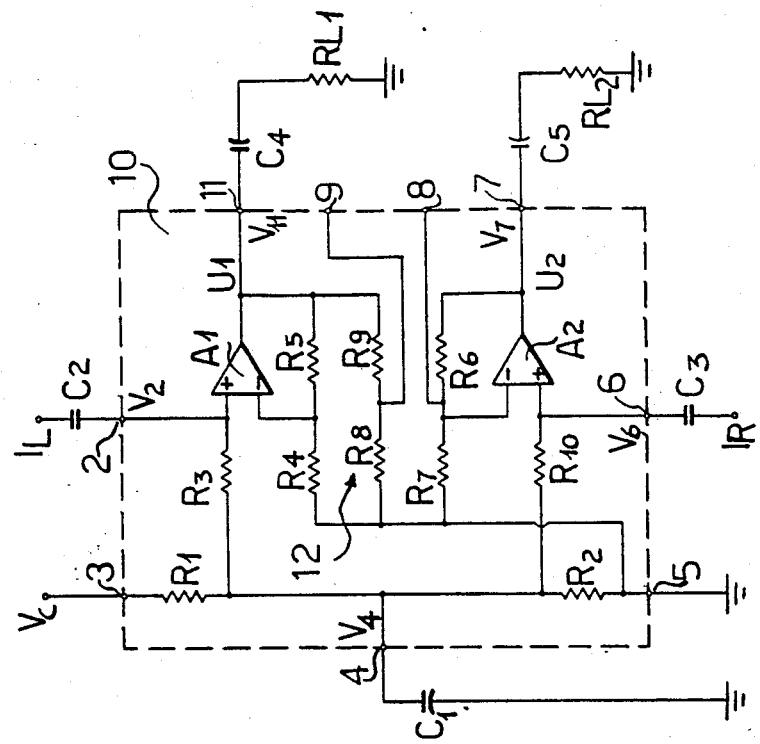
FIG. 2 shows a wiring diagram of the amplifier of FIG. 1 as operated in the stereophonic amplifier mode.

With reference to the drawing views, the numeral 1 denotes comprehensively and schematically an audio amplifier according to this invention. The amplifier 1 is constructed as an integrated circuit and carried on a so-called package 10, shown in dashed lines, having a cluster of pins for external connection, as described in detail hereinafter.

The amplifier 1 comprises a first power amplifier A1 in a so-called non-inverting configuration with a feedback resistor R5 between the output U1 and the inverting input, and a resistor R4 between said inverting input and a grounded pin 5.

The output U1 of the amplifier A1 is connected at one end of a loudspeaker represented by a resistive load $R_L$ via an output pin 11. The other end of said load $R_L$ is connected, via a pin 7, to the output U2 of a second amplifier A2 in an inverting configuration with a feedback resistor R6 between the output U2 and the inverting input, and a resistor R7 between said inverting input and the grounded pin 5.

Advantageously, a first pair of resistors, respectively indicated at R8 and R9, is parallel connected to the resistors R4 and R5 associated with the first amplifier A1, thereby forming a bridge circuit 12.

The amplifier 1 is supplied a low voltage through a pin 3 connected to a positive supply pole $V_C$.

A second resistor pair, respectively designated R1 and R2, are connected between said pole $V_C$ and ground, thus connecting the pins 3 and 5.

Said first A1 and second A2 amplifiers have their respective non-inverting inputs connected between said second pair of resistors R1 and R2 via respective input resistors, indicated at R3 and R10. Further, these non-inverting inputs of the amplifiers A1 and A2 are each connected via corresponding pins 2 and 6 to an external input terminal $I_L$ and to ground with the interposition of respective external capacitors C2 and C3.

Also connected between said resistors R1 and R2 is a pin 4, in turn connected externally to ground via a capacitor C1; a pair of output pins 8 and 9 are shorted together externally of the package 10 by means of a lead 13, and respectively connected to the inverting input of the amplifier A2 and between said first pair of resistors R8 and R9.

As shown in FIG. 2, in order to turn the amplifier 1 of this invention into a stereophonic amplifier, it will be sufficient to leave the connection open between the pins 8 and 9 of the bridge configuration and to connect each of the pins 11 and 7 corresponding to the outputs U1 and U2 across respective loads RL1 and RL2 having their opposed ends grounded, and via corresponding capacitors E4 and C5; further, the pin 6 should be connected to an external input terminal $I_R$ via the capacitor C3. In the stereophonic mode, the amplifier A2 would also be in a non-inverting configuration. Each of these loads, RL1 and RL2, constitutes an audio loudspeaker in a stereophonic configuration.

For the invention to achieve its objects, the resistors R4 to R9 should have values which are related to the values of the resistors R1 and R2 by constant factors n and m.

More specifically, the resistor R4 has a value which is n times R2; the resistor R5 has a value which is n times the difference between R1 and R2 divided by two; the resistor R8 has a value which is m times R2; the resistor R9 is equal in value to m times the difference between R1 and R2 divided by two. Furthermore, the resistor R7 shall have m times the value of the resistor R2, and the resistor R6 m times the difference between R1 and R2 divided by two.

The operation of the audio amplifier according to the invention will be next described.

The voltage value that appears on the pin 4, indicated as V4, is equal to the voltage values V2 and V6 that appear on the corresponding pins and the same as the voltage $V_C$ multiplied by the ratio of the resistor R2 to the sum of the values of the resistors R1 and R2.

The voltage value V11 appearing at the output of the amplifier A1 is given by the product of the voltage V2 by the sum of the ratio of the resistors R5 and R4 and unity. By substituting for the resistors R5 and R4 their values as a function of the values of the resistors R1 and R2, it can be shown that the output voltage value V11 is equal to one half the supply voltage $V_C$.

Such considerations hold true if it is assumed that the operational amplifiers A1 and A2 have very low output impedances, very high input impedance, and a gain which tends to infinity. With that assumption, the voltage value V7 at the output U2, pin 7, of the amplifier A2 is given by the gain of the non-inverting stage V4 to V7 and the gain of the inverting stage V11 to V7.

By applying the well-known method of overlapping effects, and therefore considering the input contributions to the non-inverting stage A2 from the voltages V6 and V11, it can be shown that:

The contribution to the output voltage V7 from just the voltage V6, assuming the voltage V11 to be zero, is equal to the product of V6 multiplied by the sum of unity plus the ratio of the resistor R6 value to the parallel one among resistors R7, R8, and R9. That value is equal to the value of the supply voltage $V_C$.

The contribution to V7 from the presence of just the voltage V11, assuming V6 to be zero, is given instead by the product, as changed in sign, of the voltage V11 multiplied by the ratio of the resistor R6 to resistor R9. That value is equal to one half the supply voltage $V_C$ negative in sign. Accordingly, the value of the output voltage V7 from the amplifier A2 is, in the rest condition, equal to one half the supply voltage; this value affords the broadest range of variation for the output voltage.

Considering, moreover, that the gain G1, as given by the ratio of the output voltage to the input voltage, between the pin 11 and the pin 2 is the same as the ratio of the resistor R5 to the resistor R4 plus unity, and that the gain G2 between the pin 7 and the pin 11, viewed as the input to the second stage, is 1, it follows that the overall gain yielded by the product of G1 multiplied by G2, is given by the sum, as changed in sign, of unity plus the ratio between the values of the resistors R5 and R4.

The audio amplifier according to the invention allows, therefore, two signals to be obtained at the outputs U1 and U2 which have the same amplitude and are in push-pull relationship, as are required for operation in the bridge mode.

When operating in the stereophonic mode, it can be shown that also in this case the value of the output voltages V7 and V11 is equal to one half the supply voltage $V_C$.

Figure 3:
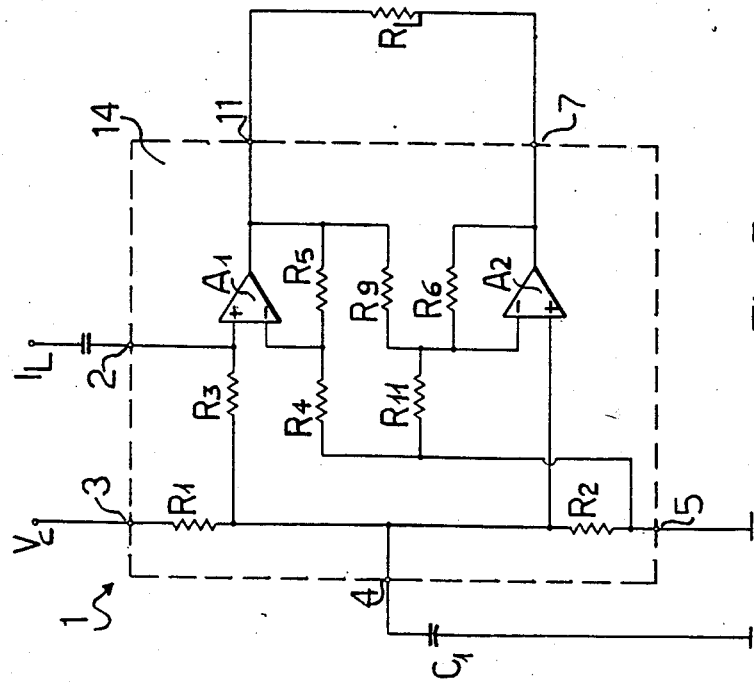
FIG. 3 shows a variation of the wiring diagram of FIG. 1.

With particular reference to the example shown in FIG. 3, there is depicted an audio amplifier according to the invention in a fixed bridge configuration. In this embodiment, items and cooperating parts which are the identical to the embodiment previously described are identified by the same reference numerals and characters.

Figure 1:
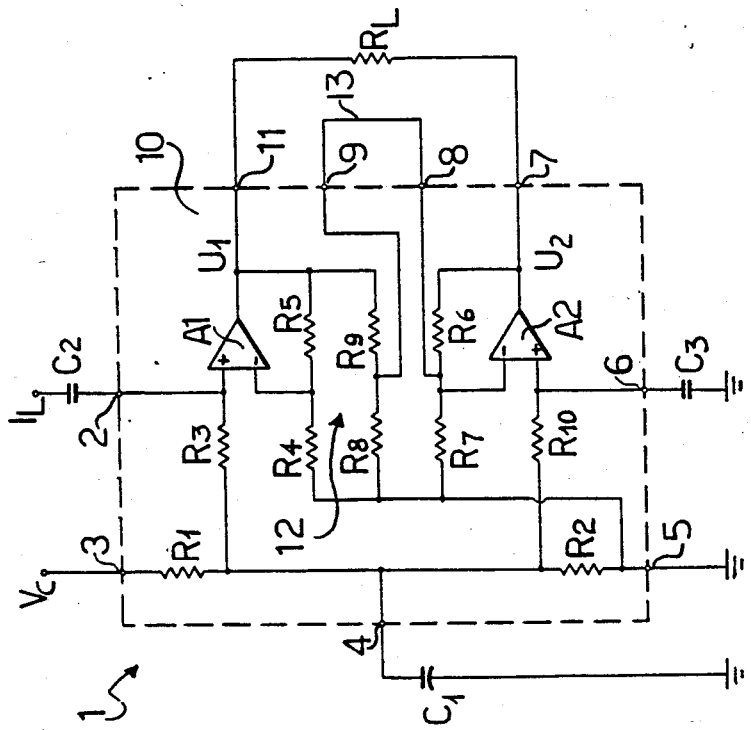
FIG. 1 shows a wiring diagram of the so-called bridge audio amplifier according to a first embodiment thereof.

The integrated circuit comprising the audio amplifier of this embodiment is carried on a package 14 having but six pins; also, the resistors R7 and R8 which were parallel connected to each other in the previous embodiment according to FIG. 1, have been replaced with a single resistor R11 whose value is equal to one half the value of the resistor R2 multiplied by the parameter m.

In addition, the non-inverting input of the amplifier A2 is, in this modified embodiment, connected solely and directly between said second pair of resistors R1 and R2.

The operation of the amplifier according to the modified embodiment of FIG. 3 is quite similar to that of the amplifier 1.

With reference in particular to the example shown in FIG. 4, a second modified embodiment of the inventive amplifier will be described hereinbelow.

In this variation, the resistor R2 has been replaced with a bridge circuit comprising resistors R12 and R13 connected between the pins 4 and 5, and resistors R14 and R15 in turn connected between the pins 4 and 5.

The resistor R3 is connected between said resistors R12 and R13 and the non-inverting input of the amplifier A1, while the resistor R10 is connected between said resistors R14 and R15 and the non-inverting input of the amplifier A2. Furthermore, a resistor R16 is provided between the pins 3 and 4 whose value differs from that of the resistor R1 provided in the circuit of the first-described embodiment.

For a given current absorbed by the resistor R16 and the bridge circuit 15, the impedance, as seen from the terminal 4, is much higher than that of the first embodiment.

The net result of this is that, for a given minimum frequency whereat the capability of the amplifier for rejection of power supply noise begins to deteriorate, a capacitor C10 may be used which has a lower capacitance than the capacitor C1 of the embodiment according to FIG. 1.

Figure 4:
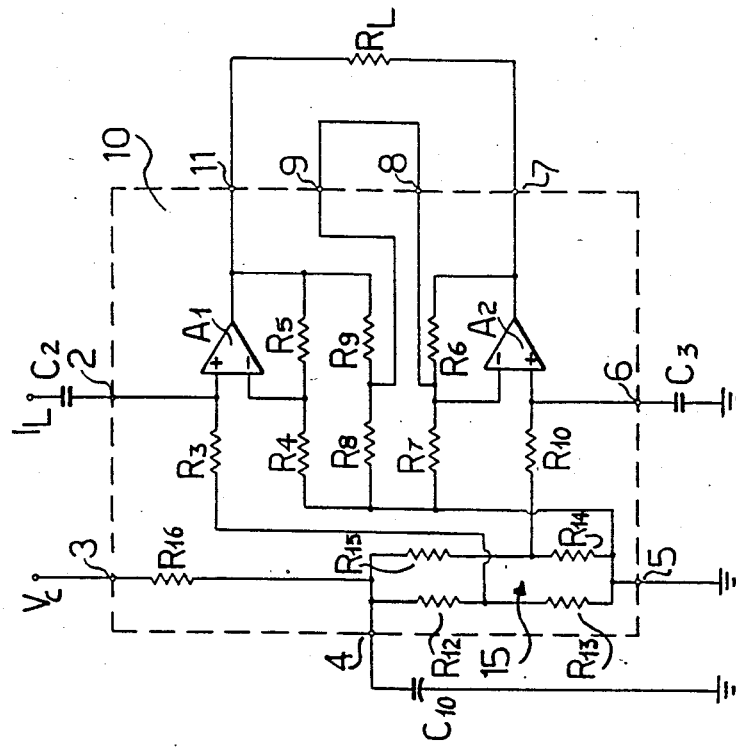
FIG. 4 shows a second variation of the wiring diagram of FIG. 1.

The values of the resistors R12 to R16 must be suitably calibrated to have the amplifier of the example according to FIG. 4 operate like the amplifier of FIG. 1. In particular, the resistors R12 and R15 should have the same value; resistors R13 and R14 should also have the same value equal to the value of the resistor R2 of FIG. 1. The product of the resistor R12 by the resistor R5, divided by the sum of these same resistances should be the same as the value of the resistor R13 minus R2/2; further, the sum of the values of the resistor R1 plus the resistor R2 of FIG. 1 should be the equivalent of the sum of the resistor R6 plus the product of the sum of resistors R12 and R3 by the sum of the resistors R4 and R15 divided by the sum of said sums.

Thus, the performance afforded by the amplifier of FIG. 1 is the same as that of the amplifier of FIG. 1.

Figure 5:
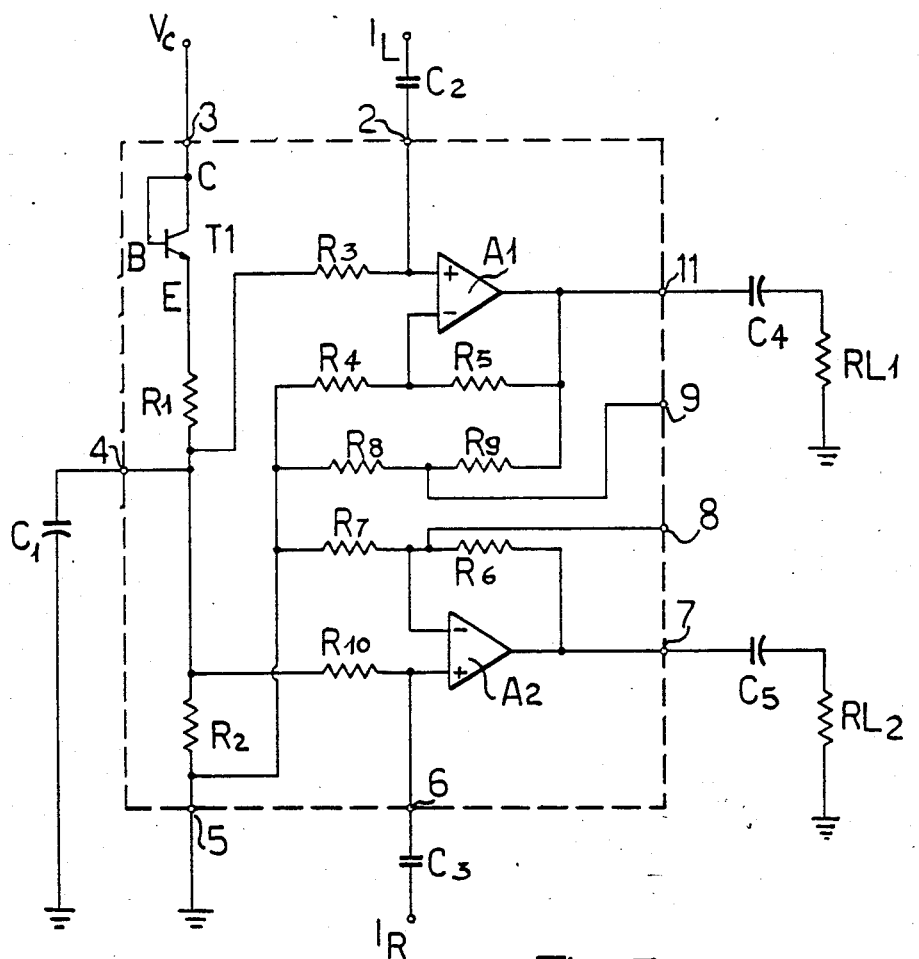
FIGS. 5, 6, and 7 show respective variations of the wiring diagram of FIG. 1.

FIG. 5 illustrates a further variation of the amplifier 2 in the stereophonic configuration. In this further variation, an npn transistor T1 is connected between the pin 3 and the resistor R1 which has a base B and a collector C connected to each other and to the pin 3, and an emitter E connected to the resistor R1.

This embodiment is advantageous where the amplifier has a non-symmetrical dynamic range which is limited downwardly by the collector-to-emitter saturation voltage, and upwardly by the sum of that voltage and the base-to-emitter voltage of the final transistor.

In that case, the maximum dynamic range of the output signal is achieved with V11 equal to V7 and equal together to the difference of the supply voltage $V_C$ minus the base-to-emitter voltage of T1 divided by two.

Figure 7:
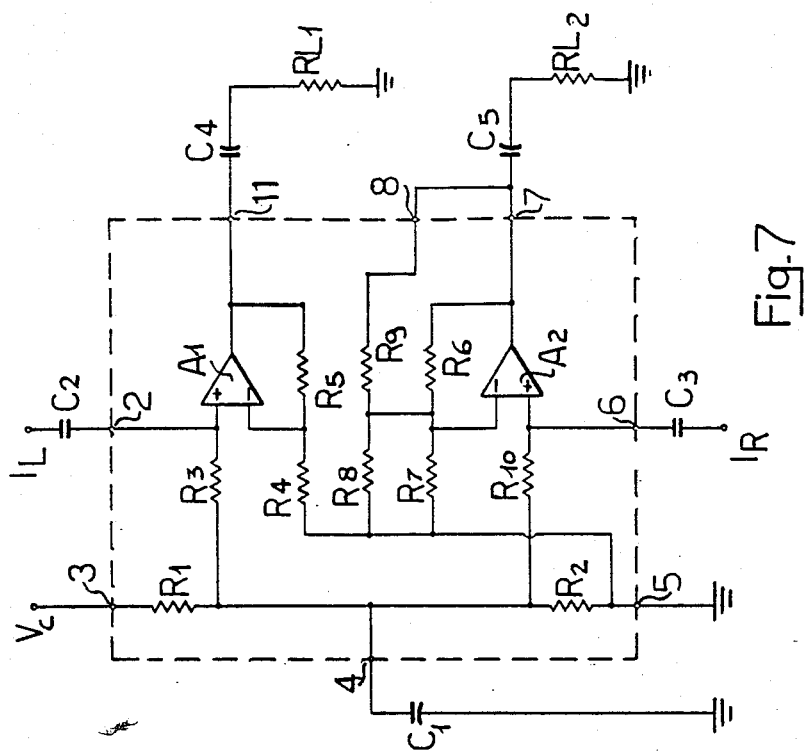
Figure 6:
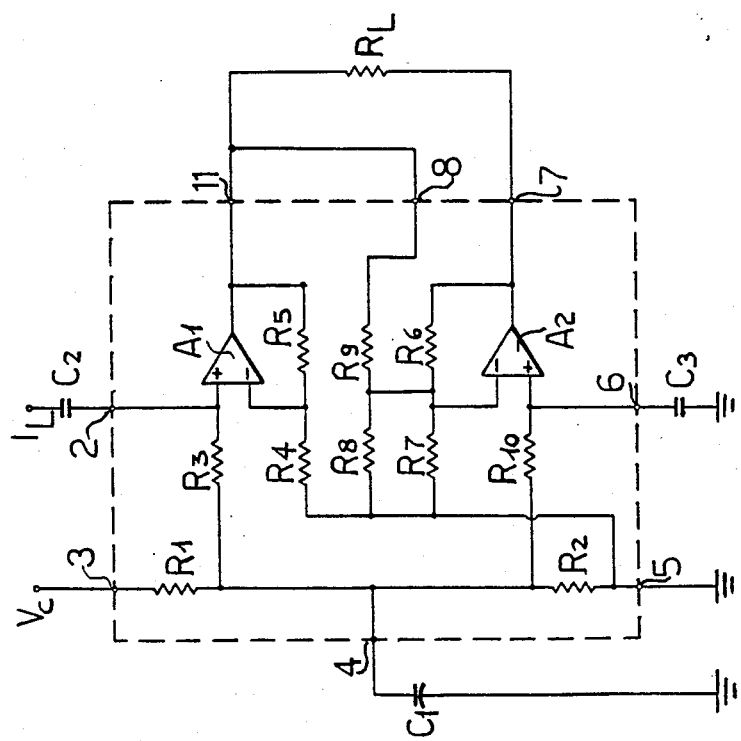

With further reference to the example of FIG. 1, by interconnecting the resistors R8 and R7 in parallel and further connecting one end of the resistor R9 to the output 11 of the amplifier via the pin 8, it becomes possible to effect the bridge-to-stereo changeover with a configuration having one pin less. In the instance of the stereophonic configuration relative to this variation, as shown in FIG. 7, the resistor R9 is connected in parallel with the feedback resistor of the second amplifier and connected to the pin 8, which is also connected to the pin 7, and hence, to one end of the second loudspeaker RL2.

The audio amplifier of this invention has, through all of its variations, the significant advantage of requiring a peculiarly small number of pins, and therefore reduced space for the integrated circuit carrier package.

In addition, the amplifier can be readily converted into a stereophonic amplifier.

I claim:

1. An integrated circuit bridge audio amplifier, said integrated circuit having terminals, said circuit comprising:
   (a) a first power amplifier in a non-inverting configuration having an inverting input, a non-inverting input, and an output,
   (b) a first feedback resistor connected between the output and the inverting input of the first amplifier,
   (c) a second resistor connected between said first amplifier inverting input and a first terminal,
   (d) a second amplifier having an inverting input, a non-inverting input, and an output,
   (e) a first pair of resistors forming a bridge circuit with said first and second resistors of said first amplifier,
   (f) a second pair of resistors connected together between a second terminal and the first terminal, said first and second amplifiers having their respective non-inverting inputs connected between said second resistor pair,
   (g) the output of said first amplifier connected to a third terminal and the output of said second amplifier connected to a fourth terminal,
   (h) one node of the bridge circuit being constituted by the connection of the first amplifier output to the first resistor,
   (i) the opposite node of the bridge circuit being constituted by the connection of the second resistor to the first terminal,
   (j) one side node of the bridge circuit being connected to the inverting input of the first amplifier and the opposite side node of the bridge circuit being connected to a fifth terminal,
   (k) the inverting input of the second amplifier being connected to a sixth terminal,
   (l) the connection between the second pair of resistors being connected to a seventh terminal.

2. The integrated circuit bridge audio amplifier as claimed in claim 1, wherein third and fourth resistors are connected respectively between the connection between the second pair of resistors and the respective non-inverting inputs of the first and second amplifiers.

3. The integrated circuit as claimed in claim 2 for use as a monophonic amplifier, further comprising means for grounding the first terminal, means for applying a positive voltage to the second terminal, means for connecting the third and fourth terminals to a loudspeaker load, means for connecting together the fifth and sixth terminals, means for connecting a capacitor to the seventh terminal, an eighth terminal connected to the non-inverting input of the first amplifier, and means for applying an audio signal to the eighth terminal.

4. The integrated circuit as claimed in claim 2 for use as a stereophonic amplifier, further comprising an eighth terminal connected to the non-inverting input of the first amplifier, a ninth terminal connected to the non-inverting input of the second amplifier, a first loudspeaker load connected to the third terminal and a second loudspeaker load connected to the fourth terminal, means for connecting a first channel audio signal to the eighth terminal and a second channel audio signal to the ninth terminal, means for grounding the first terminal, means for applying a positive voltage to the second terminal, means for connecting a capacitor to the seventh terminal.

5. The integrated circuit bridge audio amplifier as claimed in claim 1, wherein third and fourth resistors are connected respectively between the connection between the second pair of resistors and the respective non-inverting inputs of the first and second amplifiers, and fifth and sixth resistors are connected in series between the second amplifier output and the first terminal, the node between the fifth and sixth resistors being connected to the second amplifier inverting input.

6. The integrated circuit bridge audio amplifier as claimed in claim 5, wherein the resistors associated with said first and second amplifiers and of said first resistor pair have values which are related by constant factors n and m to the values of the resistors of the second resistor pair.

7. The integrated circuit bridge audio amplifier as claimed in claim 5, further comprising a transistor having connected base and collector and an emitter with its collector connected to the second terminal and its emitter connected to the resistor connected to the second terminal.

8. An integrated circuit bridge audio amplifier, said integrated circuit having terminals, said circuit comprising:
 (a) a first power amplifier in a non-inverting configuration having an inverting input, a non-inverting input, and an output,
 (b) a first feedback resistor connected between the output and the inverting input of the first amplifier,
 (c) a second resistor connected to said first amplifier inverting input,
 (d) a second amplifier having an inverting input, a non-inverting input, and an output,
 (e) a first pair of resistors forming a first bridge circuit with said first and second resistors of said first amplifier,
 (f) a third resistor and a second bridge circuit connected together between a second terminal and a first terminal, said first and second amplifiers having their respective non-inverting inputs connected to opposite nodes of said second bridge circuit,
 (g) the output of said first amplifier connected to a third terminal and the output of said second amplifier connected to a fourth terminal,
 (h) one node of the first bridge circuit being constituted by the connection of the first amplifier output to the first resistor,
 (i) the opposite node of the first bridge circuit being constituted by the connection of the second resistor to the first terminal,
 (j) one side node of the first bridge circuit being connected to the inverting input of the first amplifier and the opposite side node of the bridge circuit being connected to a fifth terminal,
 (k) the inverting input of the second amplifier being connected to a sixth terminal,
 (l) the connection between the third resistor and the second bridge circuit being connected to a seventh terminal.

9. The integrated circuit as claimed in claim 8 for use as a monophonic amplifier, further comprising means for grounding the first terminal, means for applying a positive voltage to the second terminal, means for connecting the third and fourth terminals to a loudspeaker load, means for connecting together the fifth and sixth terminals, means for connecting a capacitor to the seventh terminal, an eighth terminal connected to the non-inverting input of the first amplifier, and means for applying an audio signal to the eighth terminal.

10. An integrated circuit bridge audio amplifier, said integrated circuit having terminals, said circuit comprising:
 (a) a first power amplifier in a non-inverting configuration having an inverting input, a non-inverting input, and an output,
 (b) a first feedback resistor connected between the output and the inverting input of the first amplifier,
 (c) a second resistor directly connected between said first amplifier inverting input and a first terminal,
 (d) a second amplifier having an inverting input, a non-inverting input, and an output,
 (e) third and fourth series connected resistors, the third resistor connected to the first terminal, the fourth resistor connected to a second terminal,
 (f) a first pair of resistors connected together between a third terminal and the first terminal, said first and second amplifiers having their respective non-inverting inputs connected between said first resistor pair,
 (g) the output of said first amplifier connected to a fourth terminal and the output of said second amplifier connected to a fifth terminal,
 (h) the inverting input of the second amplifier being connected to a node between the third and fourth resistors,
 (i) the non-inverting input of the second amplifier being connected to a sixth terminal,
 (j) the connection between the first pair of resistors being directly connected to a seventh terminal.

11. The integrated circuit as claimed in claim 10 for use as a monophonic amplifier, further comprising means for grounding the first terminal, means for applying a positive voltage to the third terminal, means for connecting the fourth and fifth terminals to a loudspeaker load, means for connecting together the second and fourth terminals, means for connecting a capacitor to the sixth terminal, an eighth terminal connected to the non-inverting input of the first amplifier, and means for applying an audio signal to the eighth terminal.

12. The integrated circuit as claimed in claim 10 for use as a stereophonic amplifier, further comprising an eighth terminal connected to the non-inverting input of the first amplifier, a first loudspeaker load connected to the fourth terminal and a second loudspeaker load connected to the fifth terminal, means for connecting a first channel audio signal to the eighth terminal and a second channel audio signal to the sixth terminal, means for grounding the first terminal, means for applying a positive voltage to the third terminal, means for connecting a capacitor to the seventh terminal.

13. A bridge audio amplifier, particularly for car radios, of the type that comprises a power amplifier in a non-inverting configuration, with a feedback resistor connected between the output and the inverting input and a resistor connected between said input and ground, which power amplifier is connected to a second amplifier in an inverting configuration, characterized in that the audio amplifier comprises a first pair of resistors forming a first bridge circuit with said resistors of said first amplifier, and a second resistor bridge circuit connected via a resistor between a positive supply pole and ground, said first and second amplifiers having their non-inverting inputs connected across said second bridge circuit via respective input resistors.

14. A bridge audio amplifier for car radios, of the type that comprises a power amplifier in a non-inverting configuration, with a feedback resistor connected between the output and the inverting input and a resistor connected between said input and ground, which power amplifier is connected to a second amplifier, characterized in that the audio amplifier comprises a first pair of resistors forming a bridge circuit with said resistors of said first amplifier, and a second pair of resistors connected together between a positive power supply pole and ground, said first and second amplifiers having their respective non-inverting inputs connected between said second resistor pair through respective input resistors, and a transistor interposed to said power supply pole and said second resistor pair, said transistor having a base and collector connected to each other and to said pole and an emitter connected to an first resistor in said second resistor pair.

15. An integrated circuit bridge audio amplifier, said integrated circuit having terminals, said circuit comprising:
(a) a first power amplifier in a non-inverting configuration having an inverting input, a non-inverting input, and an output,
(b) a first feedback resistor connected between the output and the inverting input of the first amplifier,
(c) a second resistor connected between said first amplifier inverting input and a first terminal,
(d) a second amplifier having an inverting input, a non-inverting input, and an output,
(e) third and fourth series connected resistors, the third resistor connected to the first terminal, the fourth resistor connected to a second terminal,
(f) a first pair of resistors connected together between a third terminal and the first terminal, said first and second amplifiers having their respective non-inverting inputs connected between said first resistor pair,
(g) the output of said first amplifier connected to a fourth terminal and the output of said second amplifier connected to a fifth terminal,
(h) the inverting input of the second amplifier being connected to a node between the third and fourth resistors,
(i) the non-inverting input of the second amplifier being connected to a sixth terminal,
(j) the connection between the first pair of resistors being connected to a seventh terminal,
(k) a fifth resistor connected between the second amplifier output and inverting input,
(l) a sixth resistor connected between the second amplifier inverting input and the first terminal.

16. The integrated circuit as claimed in claim 15 for use as a stereophonic amplifier, further comprising means for grounding the first terminal, means for applying a positive voltage to the third terminal, means for connecting the fourth terminal to a loudspeaker load, means for connecting together the second and fifth terminals to a loudspeaker load, means for connecting a capacitor to the sixth terminal, an eighth terminal connected to the non-inverting input of the first amplifier, means for applying a first audio channel signal to the eighth terminal; and means for applying a second audio channel signal to the capacitor connected the sixth terminal.

17. A bridge audio amplifier comprising:
(a) a first amplifier in a non-inverting configuration having non-inverting and inverting inputs and an output,
(b) a second amplifier having non-inverting and inverting inputs and an output,
(c) a bridge circuit constituted by first, second, third and fourth resistances having a first node connected to the first amplifier output, a second node connected to the first amplifier inverting input, a third node connected to ground, and a fourth node,
(d) fifth and sixth resistances connected in series between a positive voltage and ground and having a fifth node between the fifth and sixth resistances,
(e) means for establishing signal ground at the fifth node,
(f) means connecting the fifth node to the non-inverting inputs of the first and second amplifiers,
(g) means for inputting an audio signal to the non-inverting input of the first amplifier,
(h) means for connecting the first and second amplifier outputs to a loudspeaker load,
(i) means for directly connecting the fourth node to the second amplifier inverting input.

* * * * *